(12) United States Patent
Noguchi et al.

(10) Patent No.: US 10,707,016 B2
(45) Date of Patent: Jul. 7, 2020

(54) METHOD OF MANUFACTURING LAMINATED ELECTRONIC COMPONENT

(71) Applicant: Murata Manufacturing Co., Ltd., Kyoto (JP)

(72) Inventors: Yutaka Noguchi, Nagaokakyo (JP); Takeshi Kobayashi, Nagaokakyo (JP); Makoto Yamamoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 174 days.

(21) Appl. No.: 15/711,341

(22) Filed: Sep. 21, 2017

(65) Prior Publication Data

US 2018/0090268 A1 Mar. 29, 2018

(30) Foreign Application Priority Data

Sep. 26, 2016 (JP) ................. 2016-187162

(51) Int. Cl.
| | |
|---|---|
| *H01F 41/00* | (2006.01) |
| *H01F 17/00* | (2006.01) |
| *H01F 27/00* | (2006.01) |
| *H01F 1/00* | (2006.01) |
| *H01G 4/00* | (2006.01) |

(Continued)

(52) U.S. Cl.
CPC ............. *H01F 41/043* (2013.01); *H01F 1/33* (2013.01); *H01F 17/0013* (2013.01); *H01F 17/04* (2013.01); *H01F 27/29* (2013.01); *H01F 41/046* (2013.01); *H01G 4/232* (2013.01); *H01G 4/30* (2013.01); *H01G 4/40* (2013.01); *H01G 4/12* (2013.01); *H01G 4/248* (2013.01); *H05K 3/4629* (2013.01)

(58) Field of Classification Search
None
See application file for complete search history.

(56) References Cited

FOREIGN PATENT DOCUMENTS

| | | |
|---|---|---|
| JP | S58-084412 A | 5/1983 |
| JP | S62-029886 B2 | 6/1987 |

(Continued)

OTHER PUBLICATIONS

An Office Action mailed by the Korean Patent Office dated Oct. 18, 2018, which corresponds to Korean Patent Application 10-2017-0121328 and is related to U.S. Appl. No. 15/711,341 with English language.

*Primary Examiner* — Linda L Gray
(74) *Attorney, Agent, or Firm* — Studebaker & Brackett PC (57) ABSTRACT

A method of manufacturing a laminated electronic component having a circuit element formed in an element body. The method includes forming a collective laminated body including a plurality of element bodies having circuit elements formed therein by laminating pluralities of insulator layers and conductor patterns; forming a plurality of external terminals on one of surfaces of the collective laminated body orthogonal to a lamination direction; forming a disappearing layer covering the external terminals and caused to disappear by heat treatment; cutting and dividing the collective laminated body having the disappearing layer formed thereon along the lamination direction into each of element bodies; applying an insulator precursor to a surface of the element body; and forming a laminated electronic component by applying a heat treatment to the element body to which the insulator precursor is applied. In the method, the insulator layers can be replaced by magnetic material layers.

6 Claims, 8 Drawing Sheets

(51) Int. Cl.
*H05K 3/00* (2006.01)
*H01F 41/04* (2006.01)
*H01F 17/04* (2006.01)
*H01F 27/29* (2006.01)
*H01F 1/33* (2006.01)
*H01G 4/40* (2006.01)
*H01G 4/232* (2006.01)
*H01G 4/30* (2006.01)
H01G 4/248 (2006.01)
H05K 3/46 (2006.01)
H01G 4/12 (2006.01)

(56) References Cited

FOREIGN PATENT DOCUMENTS

| | | |
|---|---|---|
| JP | 2005-129772 A | 5/2005 |
| JP | 2005-302796 A | 10/2005 |
| JP | 2012-256758 A | 12/2012 |
| JP | 2013-045985 A | 3/2013 |
| JP | 5190331 B2 | 4/2013 |
| JP | 2015-088522 A | 5/2015 |
| JP | 2016-186963 A | 10/2016 |

METHOD OF MANUFACTURING LAMINATED ELECTRONIC COMPONENT

CROSS-REFERENCE TO RELATED APPLICATIONS

This application claims priority to Japanese Patent Application No. 2016-187162, filed on Sep. 26, 2016, the disclosure of which is hereby incorporated by reference in its entirety.

TECHNICAL FIELD

The present disclosure relates to a method of manufacturing a laminated electronic component having magnetic material layers or insulating layers and conductor patterns laminated to form a circuit element in an element body from the conductor patterns between the magnetic material layers or between the insulating layers.

BACKGROUND

Figure 5:
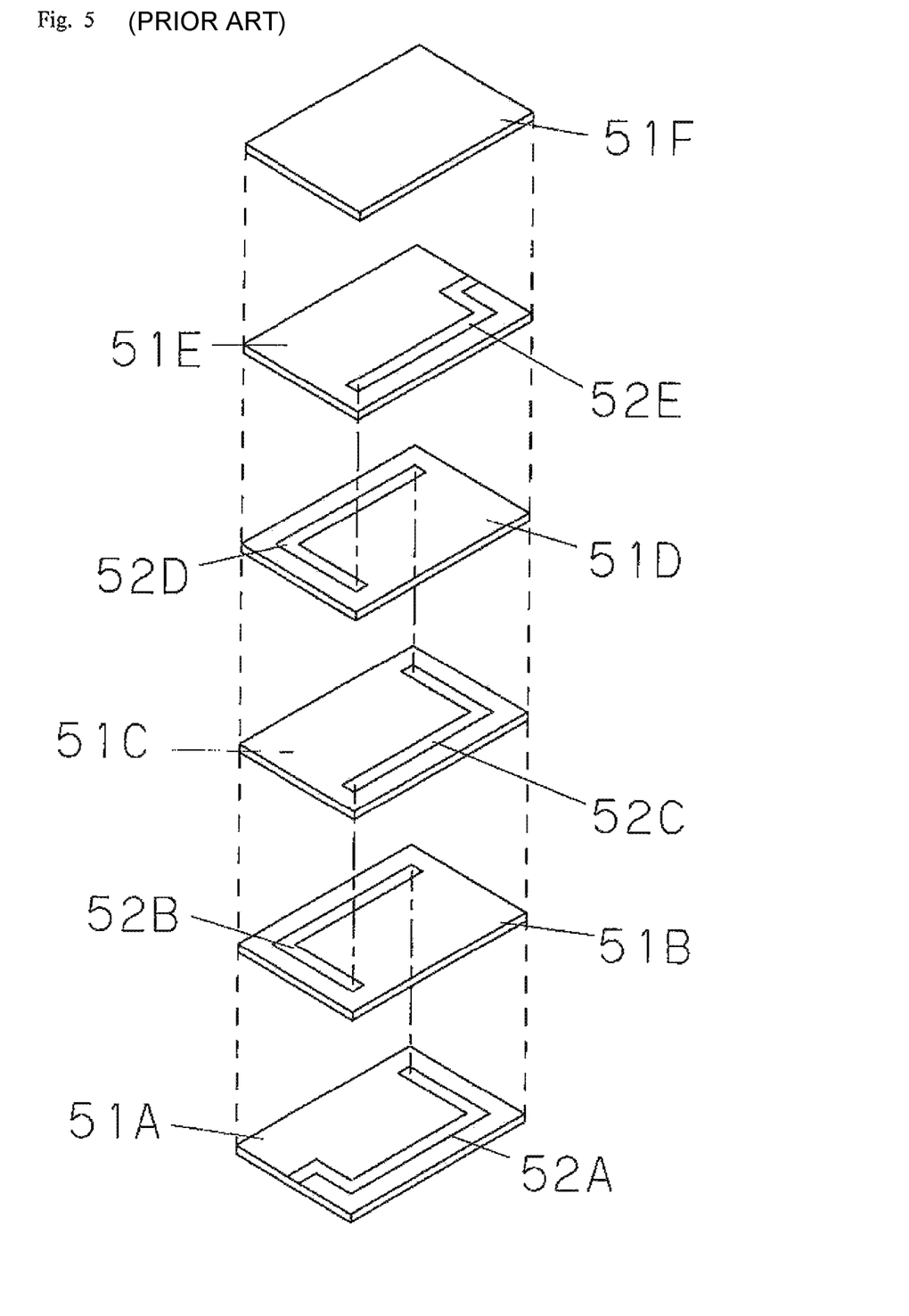
FIG. 5 is an exploded perspective view of a conventional laminated electronic component.
Figure 6:
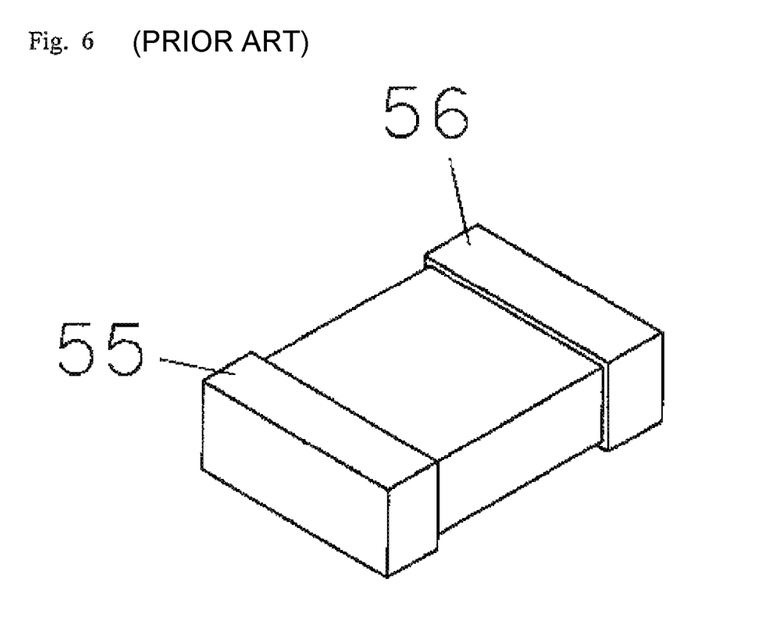
FIG. 6 is a perspective view of the conventional laminated electronic component.

As shown in FIGS. 5 and 6, conventional laminated electronic components include a component having a coil formed in an element body by laminating magnetic material layers 51A to 51F and conductor patterns 52A to 52E and by spirally connecting the conductor patterns 52A to 52E between the magnetic material layers with lead-out ends of the coil led out to longitudinal-direction side surfaces of the element body so that the coil is connected between external terminals 55, 56 formed on the longitudinal-direction side surfaces of the laminated body and four surfaces adjacent to these side surfaces.

In recent years, because of miniaturization and higher functionality of mobile devices on which this kind of electronic components is mounted, the number of electronic circuits required for these devices has increased and an area of a mounting board has become smaller. Accordingly, electronic components used for these devices are required to be reduced in size and thickness. Furthermore, minimization of land patterns for mounting and minimization of distance between adjacent electronic components are performed on mounting boards of these devices so as to mount the electronic components at higher density, and electronic components to be mounted on the mounting boards of these devices must be mounted at high density.

The conventional laminated electronic components have external terminals formed on the longitudinal-direction side surfaces of the laminated body and four surfaces adjacent to these side surfaces and therefore have a problem that a solder bridge is formed between the external terminals of adjacent electronic components due to a solder fillet at the time of mounting and soldering on a mounting board, a positional displacement of a mounting position at the time of mounting on the mounting board, etc., causing a short circuit. Therefore, it is difficult to mount the electronic components on a mounting board on which the components are mounted at a high density as described above.

To solve such a problem, a laminated electronic component having external terminals formed on the longitudinal-direction side surfaces of the element body and four surfaces adjacent to these side surfaces is covered with an insulator film except a bottom surface (see, e.g., Japanese Laid-Open Patent Publication No. 2012-256758).

However, in such a conventional laminated electronic component, since the thickness of the insulator film is added to the element dimension, the shape of the element body must be made smaller by the thickness of the insulator film, and the component has a problem that the desired inductance and DC superimposition characteristics are difficult to ensure. Additionally, such a conventional laminated electronic component has a problem that since the insulator film is formed after the external terminals are formed, it is difficult to form the insulator film accurately, and that if the insulator film goes around to the bottom surface, the component easily deviates from a land pattern of a mounting board at the time of mounting.

Figure 7:
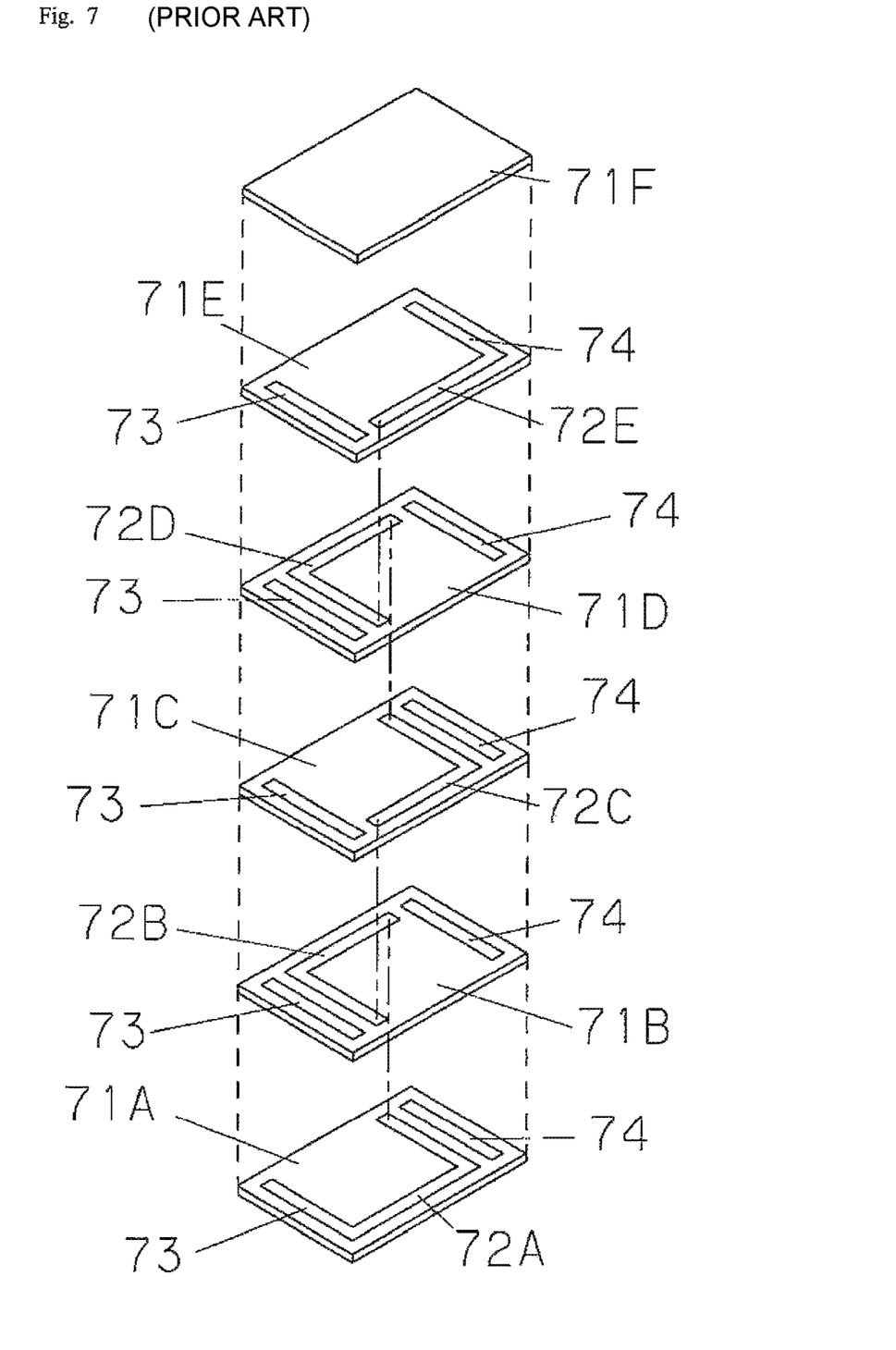
FIG. 7 is an exploded perspective view of another conventional laminated electronic component.
Figure 8:
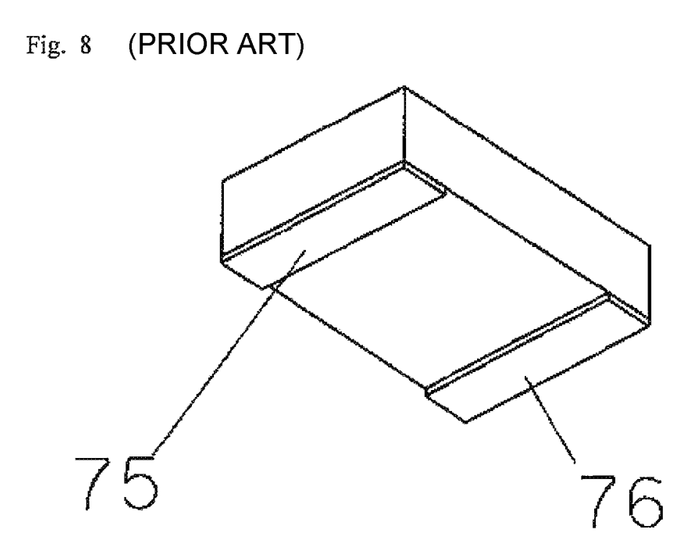
FIG. 8 is a perspective view of the other conventional laminated electronic component.

On the other hand, as shown in FIGS. 7 and 8, magnetic material layers 71A to 71E are provided with conductor patterns 72A to 72E and conductors 73, 74 penetrating the magnetic material layers, and a coil is formed in a element body by laminating the magnetic material layers 71A to 71F and the conductor patterns 72A to 72E and by spirally connecting the conductor patterns 72A to 72E between the magnetic material layers in the element body provided with the conductors 73, 74 such that both ends of the coil are led out by the conductors 73, 74 to a bottom surface of the element body and connected to external terminals 75, 76 formed on the bottom surface of the element body (see, e.g., Japanese Examined Patent Application Publication No. 62-29886).

SUMMARY

The present disclosure provides a method of manufacturing a laminated electronic component having a circuit element formed in an element body of pluralities of alternately laminated insulator layers and conductor patterns from the conductor patterns between the insulator layers. The method includes: forming a collective laminated body including a plurality of element bodies having circuit elements formed therein by alternately laminating pluralities of insulator layers and conductor patterns; forming a plurality of external terminals on one of surfaces of the collective laminated body orthogonal to a lamination direction; forming a disappearing layer covering the external terminals and caused to disappear by heat treatment on the surface of the collective laminated body on which the plurality of external terminals is formed; cutting and dividing the collective laminated body having the disappearing layer formed thereon along the lamination direction into each of element bodies; applying an insulator precursor to a surface of the element body; and forming a laminated electronic component by applying a heat treatment to the element body to which the insulator precursor is applied. The circuit element of the laminated electronic component has a first end portion that is a lead-out end of the conductor pattern close to a bottom surface of the element body on which the external terminals are disposed and a second end portion that is a lead-out end of the conductor pattern distant from the bottom surface of the element body. The first end portion is connected to the first external terminal disposed on the bottom surface of the element body while the second end portion is connected to the second external terminal disposed on the bottom surface of the element body via a conductor disposed on a side surface of the element body with a surface thereof at least partially exposed. The surface of the conductor exposed on the side surface of the element body is covered with an insulator film that is a heat-treated object of the insulator precursor. In the method, the insulator layers can be replaced by magnetic material layers.

DETAILED DESCRIPTION

In the laminated electronic component described in Japanese Examined Patent Application Publication No. 62-29886, a sufficient distance must be ensured between the coil and the conductors so as to ensure insulation and withstand voltage in the laminated body, and the component has a problem that the desired inductance and DC superimposition characteristics are difficult to ensure. Furthermore, since such a conventional laminated electronic component has the conductors disposed in the laminated body such that both ends of the coil are connected to the external electrodes, it is difficult to ensure a sufficient magnetic flux passing area in the laminated body as compared to the conventional laminated electronic component shown in FIGS. 6 and 7, and the component has a problem that a desired inductance is not acquired or, even if the desired inductance is acquired, it is difficult to ensure the DC superimposition characteristics without increasing the resistance value of the coil.

It is an object of the present disclosure to solve these problems and to provide a manufacturing method capable of highly accurately manufacturing a laminated electronic component enabling high-density mounting without degrading characteristics such as DC superimposition characteristics, insulation characteristics, and withstand voltage characteristics.

The present disclosure provides a method of manufacturing a laminated electronic component having insulator layers and conductor patterns laminated to form a circuit element in an element body from the conductor patterns between the insulator layers. The method includes a step of forming a collective laminated body having circuit elements formed therein by laminating insulator layers and conductor patterns and forming a plurality of external terminals on an upper surface of the collective laminated body, a step of forming a disappearing layer caused to disappear by heat treatment so as to cover the external terminals on the upper surface of the collective laminated body having the plurality of the external terminals formed thereon, a step of cutting and dividing the collective laminated body into each of element bodies, a step of coating the element body with an insulator, and a step of applying a heat treatment to the element body coated with the insulator to form a laminated electronic component having a circuit element with a lead-out end close to a bottom surface of the element body being led out to the bottom surface of the element body, a lead-out end distant from the bottom surface of the element body being led out to a side surface of the element body, the lead-out end of the circuit element close to the bottom surface of the element body being connected to the external terminal formed on the bottom surface of the element body, the lead-out end of the circuit element distant from the bottom surface of the element body being connected to the external terminal formed on the bottom surface of the element body via a conductor having a surface exposed on the side surface of the element body, and the conductor exposed on the side surface of the element body being covered with an insulator film.

In other words, the present disclosure provides a method of manufacturing a laminated electronic component having a circuit element formed in an element body of pluralities of alternately laminated insulator layers and conductor patterns from the conductor patterns between the insulator material layers. The method includes forming a collective laminated body including a plurality of element bodies having circuit elements formed therein by alternately laminating pluralities of insulator layers and conductor patterns; forming a plurality of external terminals on one of surfaces of the collective laminated body orthogonal to a lamination direction; forming a disappearing layer covering the external terminals and caused to disappear by heat treatment on the surface of the collective laminated body on which the plurality of external terminals is formed; cutting and dividing the collective laminated body having the disappearing layer formed thereon along the lamination direction into each of element bodies; applying an insulator precursor to a surface of the element body; and forming a laminated electronic component by applying a heat treatment to the element body to which the insulator precursor is applied. The circuit element of the laminated electronic component has a first end portion that is a lead-out end of the conductor pattern close to a bottom surface of the element body on which the external terminals are disposed and a second end portion that is a lead-out end of the conductor pattern distant from the bottom surface of the element body. The first end portion is connected to the first external terminal disposed on the bottom surface of the element body while the second end portion is connected to the second external terminal disposed on the bottom surface of the element body via a conductor disposed on a side surface of the element body with a surface thereof partially exposed. The surface of the conductor exposed on the side surface of the element body is covered with an insulator film that is a heat-treated object of the insulator precursor.

The present disclosure also provides a method of manufacturing a laminated electronic component having magnetic material layers and conductor patterns laminated to form a circuit element in an element body from the conductor patterns between the magnetic material layers. The method includes a step of forming a collective laminated body having circuit elements formed therein by laminating magnetic material layers and conductor patterns and forming a plurality of external terminals on an upper surface of the collective laminated body, a step of forming a disappearing layer caused to disappear by heat treatment so as to cover the external terminals on the upper surface of the collective laminated body having the plurality of the external terminals formed thereon, a step of cutting and dividing the collective laminated body into each of element bodies, a step of coating the element body with an insulator, and a step of applying a heat treatment to the element body coated with the insulator to form a laminated electronic component having a circuit element with a lead-out end close to a bottom surface of the element body being led out to the bottom surface of the element body, a lead-out end distant from the bottom surface of the element body being led out to a side surface of the element body, the lead-out end of the circuit element close to the bottom surface of the element body being connected to the external terminal formed on the bottom surface of the element body, the lead-out end of the circuit element distant from the bottom surface of the element body being connected to the external terminal formed on the bottom surface of the element body via a conductor having a surface exposed on the side surface of the element body, and the conductor exposed on the side surface of the element body being covered with an insulator film.

In other words, the present disclosure also provides a method of manufacturing a laminated electronic component having a circuit element formed in an element body of pluralities of alternately laminated magnetic material layers and conductor patterns from the conductor patterns between the magnetic material layers. The method includes forming a collective laminated body including a plurality of element bodies having circuit elements formed therein by alternately laminating pluralities of magnetic material layers and conductor patterns; forming a plurality of external terminals on one of surfaces of the collective laminated body orthogonal to a lamination direction; forming a disappearing layer covering the external terminals and caused to disappear by heat treatment on the surface of the collective laminated body on which the plurality of external terminals is formed; cutting and dividing the collective laminated body having the disappearing layer formed thereon along the lamination direction into each of element bodies; applying an insulator precursor to a surface of the element body; and forming a laminated electronic component by applying a heat treatment to the element body to which the insulator precursor is applied. The circuit element of the laminated electronic component has a first end portion that is a lead-out end of the conductor pattern close to a bottom surface of the element body on which the external terminals are disposed and a second end portion that is a lead-out end of the conductor pattern distant from the bottom surface of the element body. The first end portion is connected to the first external terminal disposed on the bottom surface of the element body while the second end portion is connected to the second external terminal disposed on the bottom surface of the element body via a conductor disposed on a side surface of the element body with a surface thereof partially exposed. The surface of the conductor exposed on the side surface of the element body is covered with an insulator film that is a heat-treated object of the insulator precursor.

The present disclosure is a method of manufacturing a laminated electronic component having pluralities of insulator layers and conductor patterns alternately laminated to form a circuit element in an element body from the conductor patterns between the insulator layers. The method includes forming a collective laminated body including a plurality of element bodies having circuit elements formed therein by laminating insulator layers and conductor patterns and forming a plurality of external terminals on an upper surface of the collective laminated body, forming a disappearing layer covering the external terminals and caused to disappear by heat treatment on the surface of the collective laminated body on which the plurality of external terminals is formed, cutting and dividing the collective laminated body along the lamination direction into each of element bodies, applying an insulator precursor to the element body, and forming a laminated electronic component by applying a heat treatment to the element body to which the insulator precursor is applied. In the circuit element of the laminated electronic component, the first end portion is the lead-out end of the conductor pattern close to the bottom surface of the element body having the external terminals disposed thereon and is led out to the bottom surface of the element body. The second end portion is the lead-out end of the conductor pattern distant from the bottom surface of the element body and is led out to the side surface of the element body. The first end portion is connected to the first external terminal formed on the bottom surface of the element body. The second end portion is connected to the second external terminal disposed on the bottom surface of the element body via the conductor disposed on the side surface of the element body with a surface thereof exposed. The surface of the conductor exposed on the side surface of the element body is covered with the insulator film. Therefore, the laminated electronic component enabling high-density mounting can be manufactured with high accuracy without degrading characteristics such as DC superimposition characteristics, insulation characteristics, and withstand voltage characteristics.

The present disclosure is a method of manufacturing a laminated electronic component having pluralities of magnetic material layers and conductor patterns alternately laminated to form a circuit element in an element body from the conductor patterns between the magnetic material layers. The method includes forming a collective laminated body including a plurality of element bodies having circuit elements formed therein by laminating magnetic material layers and conductor patterns and forming a plurality of external terminals on an upper surface of the collective laminated body, forming a disappearing layer covering the external terminals and caused to disappear by heat treatment on the surface of the collective laminated body on which the plurality of external terminals is formed, cutting and dividing the collective laminated body along the lamination direction into each of element bodies, applying an insulator precursor to the element body, and forming a laminated electronic component by applying a heat treatment to the element body to which the insulator precursor is applied. In the circuit element of the laminated electronic component, the first end portion is the lead-out end of the conductor pattern close to the bottom surface of the element body having the external terminals disposed thereon and is led out to the bottom surface of the element body. The second end portion is the lead-out end of the conductor pattern distant from the bottom surface of the element body and is led out to the side surface of the element body. The first end portion is connected to the first external terminal disposed on the bottom surface of the element body. The second end portion is connected to the second external terminal disposed on the bottom surface of the element body via the conductor disposed on the side surface of the element body with a surface thereof exposed. The surface of the conductor exposed on the side surface of the element body is covered with the insulator film. Therefore, the laminated electronic component enabling high-density mounting can be manufactured with high accuracy without degrading characteristics such as DC superimposition characteristics, insulation characteristics, and withstand voltage characteristics.

In the present method of manufacturing a laminated electronic component, first, insulator layers and conductor patterns are laminated to form a collective laminated body including a plurality of element bodies having circuit elements formed therein, and a plurality of external terminals is formed on an upper surface of the collective laminated body, that is one of the surfaces orthogonal to the lamination direction of the collective laminated body. The external terminals are electrically connected to the circuit elements of the element bodies. A disappearing layer caused to disappear by heat treatment is then formed so as to cover the external terminals on the upper surface of the collective laminated body on which the plurality of the external terminals is formed. The disappearing layer may be formed not only on the upper surface of the collective laminated body but also on a bottom surface, that is the surface opposite to the upper surface, of the collective laminated body. Subsequently, the collective laminated body is cut along the lamination direction and divided into each of the element bodies. An insulator precursor is applied to a surface, that is at least a side surface orthogonal to the upper surface, of the divided element body. A heat treatment is applied to the element body to which the insulator precursor is applied. An insulator film is formed from the insulator precursor by the heat treatment and covers the surface of the element body. The disappearing layer disappears due to the heat treatment.

The laminated electronic component manufactured in this way has the insulator layers and the conductor patterns laminated such that the conductor patterns between the insulator layers are connected to form a circuit element, e.g., a capacitor, a coil and the like, in the element body. The element body has a bottom surface on which the external terminals are disposed and a side surface adjacent to the bottom surface and parallel to the lamination direction. In the circuit element, a first end portion is a lead-out end of the conductor pattern close to the bottom surface of the element body having the external terminals formed thereon and is led out to the bottom surface of the element body, and a second end portion is a lead-out end of the conductor pattern distant from the bottom surface of the element body and is led out to the side surface of the element body. The first end portion is electrically connected to the first external terminal formed on the bottom surface of the element body, and the second end portion is connected to the second external terminal formed on the bottom surface of the element body via a conductor disposed on the side surface of the element body with a surface thereof at least partially exposed. The surface of the conductor exposed on the side surface of the element body is covered with the insulator film.

Therefore, since the laminated electronic component manufactured by the method of manufacturing a laminated electronic component of the present disclosure has no external terminal on the side surface of the laminated body, so that no solder fillet is formed on the side surface at the time of soldering to a mounting board.

In the method of manufacturing a laminated electronic component, a laminated electronic component may be formed by using magnetic material layers instead of the insulator layers. In such a laminated electronic component, the distance between positions causing a potential difference and the magnetic flux passing area in the laminated body can be made larger than those of the conventional laminated electronic component shown in FIGS. 7 and 8. Furthermore, since this laminated electronic component has no external terminal formed on the side surface, the volume of the laminated body can be made larger than that of the conventional laminated electronic component shown in FIGS. 5 and 6 by the volume of the external terminal and the insulator film, which reduces the magnetic flux density per unit volume, so that the characteristics can be improved.

Embodiments

A method of manufacturing a laminated electronic component of the present disclosure will now be described with reference to FIGS. 1 to 4.

Figure 1:
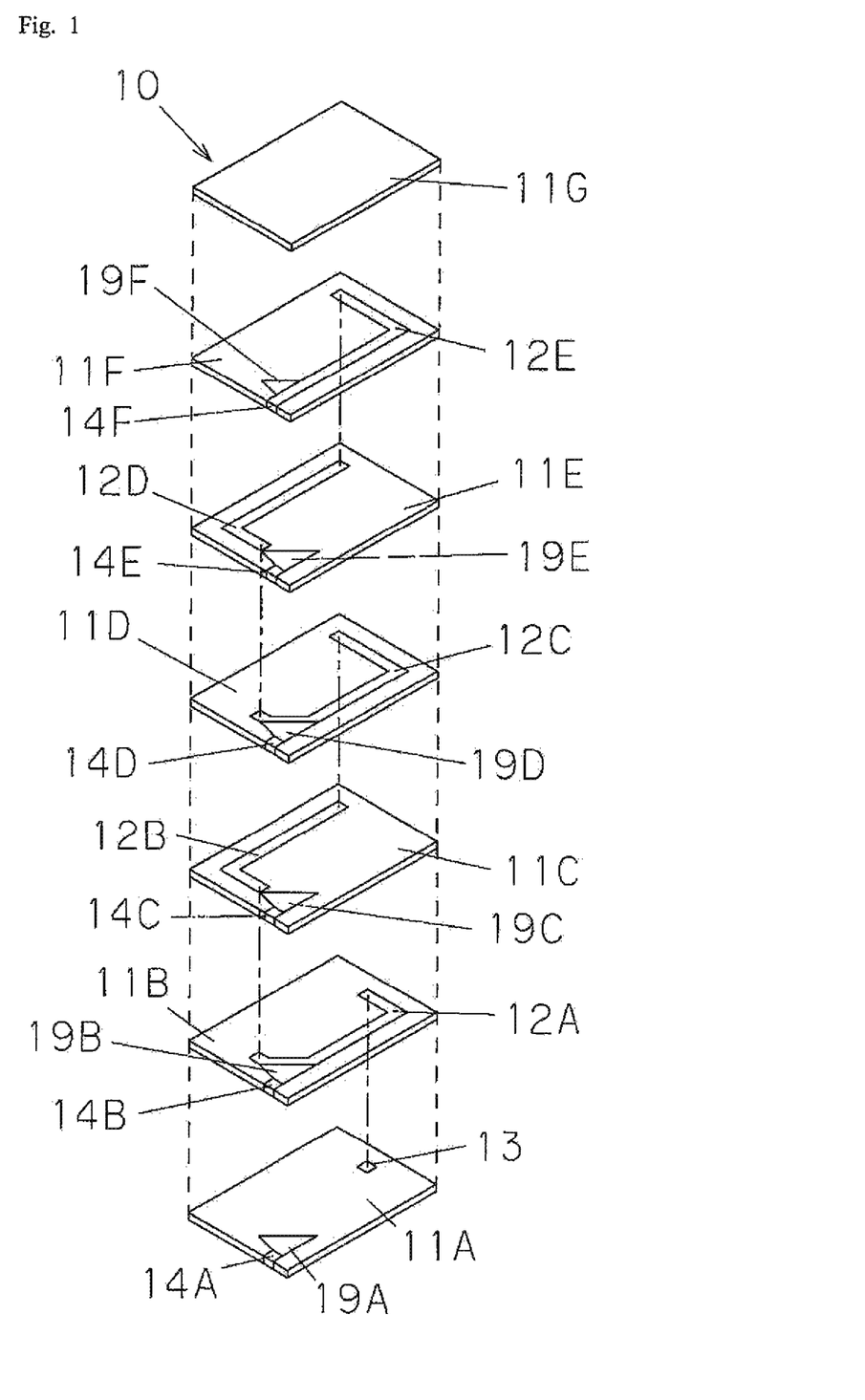
FIG. 1 is an exploded perspective view of a laminated electronic component according to the present disclosure.

FIG. 1 is an exploded perspective view of a laminated electronic component manufactured by the method of manufacturing of the present disclosure. In FIG. 1, reference numerals 10, 11A to 11G, and 12A to 12E denote an element body, magnetic material layers, and conductor patterns, respectively.

The element body 10 is formed by laminating the magnetic material layers 11A to 11G formed into a rectangular sheet shape and the conductor patterns 12A to 12E. The element body 10 has a bottom surface orthogonal to a lamination direction and having an external terminal disposed thereon, and four side surfaces adjacent to the bottom surface and parallel to the lamination direction. The four side surfaces are two longitudinal-direction side surfaces perpendicular to the longitudinal direction of the rectangular magnetic material layers and two lateral-direction side surfaces parallel to the longitudinal direction of the magnetic material layers. The magnetic material layers 11A to 11G are made of a metal magnetic material such as metal magnetic powder of Fe, Fe—Si—Cr, Fe—Si—Al, Fe—Ni—Al, Fe—Cr—Al, amorphous, etc. The conductor patterns 12A to 12E are made of a conductor paste that is a metal material such as silver, silver-based material, gold, gold-based material, copper, copper-based material, etc. made into a paste form.

A magnetic material layer 11A is formed into a rectangular sheet shape and has a cutout formed in one of the longitudinal-direction side surfaces, a first through-hole formed at a position corresponding to one end of the conductor pattern 12A described later, and a second through-hole formed between a portion close to the cutout corresponding to the conductor pattern 12A described later and the cutout. A conductor 13 having the same thickness as the magnetic material layer 11A is formed in the first through-hole. A conductor 14A having the same thickness as the magnetic material layer 11A is formed in the cutout formed in the magnetic material layer 11A. The conductor 13 and the conductor 14A are formed by printing using the same material as the material forming the conductor pattern. Additionally, an insulator part 19A is formed in the second through-hole. The insulator part 19A is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11A.

The magnetic material layer 11B is formed into a rectangular sheet shape and has a cutout formed in one of the longitudinal-direction side surfaces, a first through-hole formed at a position corresponding to one end of the conductor pattern 12A described later, and a second through-hole formed between the cutout and a portion of the conductor pattern 52A described later close to the cutout. In the cutout formed in the magnetic material layer 11B, a conductor 14B having the same thickness as the magnetic material layer 11B is formed by printing using the same material as the conductor pattern 12A. A conductor is also formed in the first through-hole in the same way. The conductor pattern 12A is formed on an upper surface of the magnetic material layer 11B, that is the surface on the side opposite to the surface facing the magnetic material layer 11A. This conductor pattern 12A is formed for less than one turn and has one end connected to the conductor 13 via the conductor in the first through-hole formed in the magnetic material layer 11B. In the second through-hole, an insulator part 19B is formed having a thickness that is the sum of the thickness of the magnetic material layer 11B and the thickness of the conductor pattern 12A. The insulator part 19B is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11B.

A magnetic material layer 11C is formed into a rectangular sheet shape and has a cutout formed in one of the longitudinal-direction side surfaces, a first through-hole formed at a position corresponding to one end of the conductor pattern 12B described later, and a second through-hole formed between a portion close to the cutout at a position corresponding to a conductor pattern 12C described later and the cutout. In the cutout of the magnetic material layer 11C, a conductor 14C having the same thickness as the magnetic material layer 11C is formed by printing using the same material as the conductor pattern 12B. A conductor is also formed in the first through-hole in the same way. The conductor pattern 12B is formed on the upper surface of the magnetic material layer 11C. This conductor pattern 12B is formed for less than one turn and has one end connected to the other end of the conductor pattern 12A via the conductor in the first through-hole formed in the magnetic material layer 11C. In the second through-hole formed between the cutout and the portion close to the cutout at the position corresponding to the conductor pattern, an insulator part 19C is formed having a thickness that is the sum of the thickness of the magnetic material layer 11C and the thickness of the conductor pattern 12B. The insulator part 19C is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11C.

A magnetic material layer 11D is formed into a rectangular sheet shape and has a cutout formed in one of the longitudinal-direction side surfaces, a first through-hole formed at a position corresponding to one end of the conductor pattern 12C described later, and a second through-hole formed between the cutout and a portion of the conductor pattern 12C described later close to the cutout. In the cutout of the magnetic material layer 11D, a conductor 14D having the same thickness as the magnetic material layer 11D is formed by printing using the same material as the conductor pattern 12C. A conductor is also formed in the first through-hole in the same way. The conductor pattern 12C is formed on the upper surface of the magnetic material layer 11D. This conductor pattern 12C is formed for less than one turn and has one end connected to the other end of the conductor pattern 12B via the conductor in the first through-hole formed in the magnetic material layer 11D. In the second through-hole, an insulator part 19D is formed having a thickness that is the sum of the thickness of the magnetic material layer 11D and the thickness of the conductor pattern 12C. The insulator part 19D is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11D.

A magnetic material layer 11E is formed into a rectangular sheet shape and has a cutout formed in one of the longitudinal-direction side surfaces, a first through-hole formed at a position corresponding to one end of the conductor pattern 12D described later, and a second through-hole formed between the cutout and a portion close to the cutout corresponding to the conductor pattern 12C. In the cutout of the magnetic material layer 11E, a conductor 14E having the same thickness as the magnetic material layer 11E is formed by printing using the same material as the conductor pattern 12D. A conductor is also formed in the first through-hole in the same way. The conductor pattern 12D is formed on the upper surface of the magnetic material layer 11E. This conductor pattern 12D is formed for less than one turn and has one end connected to the other end of the conductor pattern 12C via the conductor in the first through-hole formed in the magnetic material layer 11E. In the second through-hole, an insulator part 19E is formed having a thickness that is the sum of the thickness of the magnetic material layer 11E and the thickness of the conductor pattern 12D. The insulator part 19E is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11E.

A magnetic material layer 11F is formed into a rectangular sheet shape and has a cutout formed in one of the longitudinal-direction side surfaces, a first through-hole formed at a position corresponding to one end of the conductor pattern 12E described later, and a second through-hole formed between the cutout and a portion close to the cutout corresponding to the conductor pattern 12C. In the cutout of the magnetic material layer 11F, a conductor 14F having the same thickness as the magnetic material layer 11F is formed by printing using the same material as the conductor pattern 12E. A conductor is also formed in the first through-hole in the same way. In the conductor pattern 12E less than one turn is formed on the upper surface of the magnetic material layer 11F and has one end connected to the other end of the conductor pattern 12D via the conductor in the through-hole formed in the magnetic material layer 11F and the other end led out to the longitudinal-direction side surface of the magnetic material layer 11F. In the second through-hole, an insulator part 19F is formed having a thickness that is the sum of the thickness of the magnetic material layer 11F and the thickness of the conductor pattern 12E. The insulator part 19F is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 11F.

A magnetic material layer 11G for protecting the conductor pattern is formed on the magnetic material layer 11F having the conductor pattern 12E formed thereon.

Figure 2:
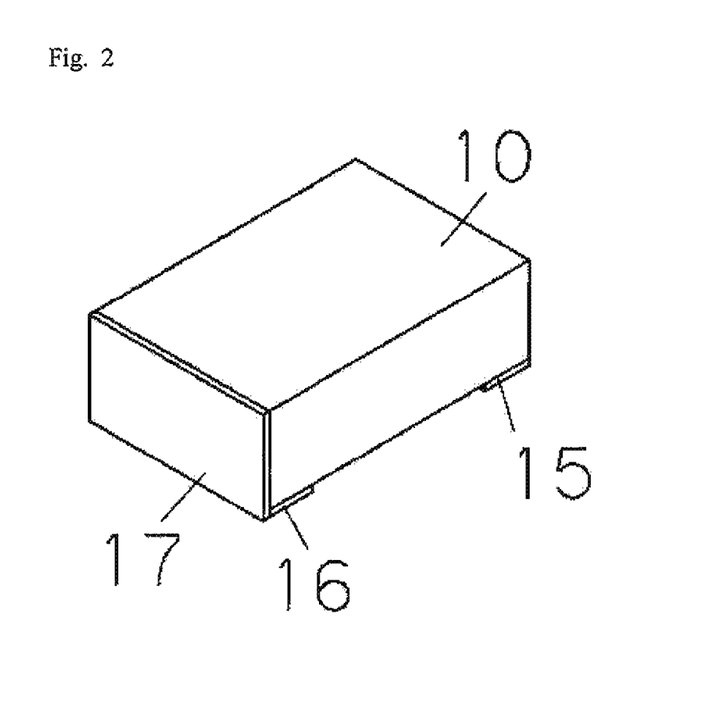
FIG. 2 is a perspective view of the laminated electronic component according to the present disclosure.

By spirally connecting the conductor patterns 12A to 12E between the magnetic material layers in this way, a coil pattern is formed in an element body. In this element body 10, a conductor connected to the first end portion serving as the lead-out end of the conductor pattern close to the bottom surface is exposed on the bottom surface, and the second end portion serving as the lead-out end of the conductor pattern distant from the bottom surface of the element body is exposed on the longitudinal-direction side surface of the element body 10 together with a surface of a conductor connected to the second end portion. In this case, the conductor extends in the lamination direction of the magnetic material layers between the bottom surface of the element body 10 and the second end portion. This element body 10 has a pair of external terminals 15, 16 formed on the bottom surface as shown in FIG. 2, and the lead-out ends of the coil pattern are connected via the conductors so that a coil is connected between the paired external terminals 15, 16. Furthermore, the surface of the conductor exposed on the longitudinal-direction side surface of the element body 10 is covered with an insulator film 17 formed on the side surface of the element body 10 to which the second end portion of the coil pattern is led out. The insulator film 17 is made of an insulating material, for example, a dielectric material such as glass and glass ceramics, a magnetic material such as ferrite, or a nonmagnetic material, and is particularly made of a material higher in volume resistivity and withstand voltage than the material constituting the element body 10. In this element body 10, an insulator part extending in the lamination direction of the magnetic material layers is formed between the conductor connected to the second end portion of and the coil pattern.

Figure 3A:
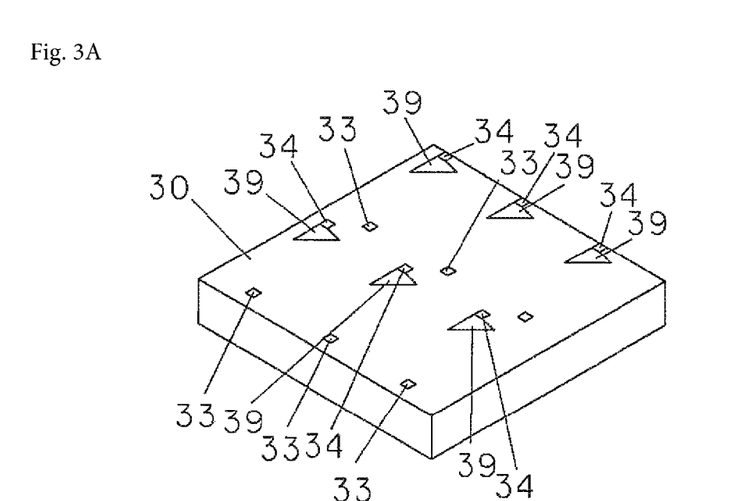
FIG. 3A is a perspective view for explaining a manufacturing step of an embodiment of a method of manufacturing a laminated electronic component of the present disclosure.

The laminated electronic component as described above is manufactured as follows. First, the magnetic material layers made of a metal magnetic material and the conductor patterns are laminated as described above and the conductor patterns are connected via the magnetic material layers to form a collective laminated body having a plurality of coils formed therein. In each of the coils, as shown in FIG. 3A, the first end portion is the lead-out end of the conductor pattern close to an upper surface of the collective laminated body which corresponds to the bottom surface of the element body and is led out via a conductor 33 to the upper surface of a collective laminated body 30, while the second end portion is the lead-out end of the conductor pattern distant from the upper surface of the collective laminated body and is led out to a position corresponding to a side surface of an element body described later, and the second end portion of the coil is led out to the upper surface of the collective laminated body 30 via a conductor 34 having a surface at least partially exposed on the side surface of the element body. It is noted that reference numeral 39 denotes an insulating part formed in the element body described later and exposed on the bottom surface of the element body.

Figure 3B:
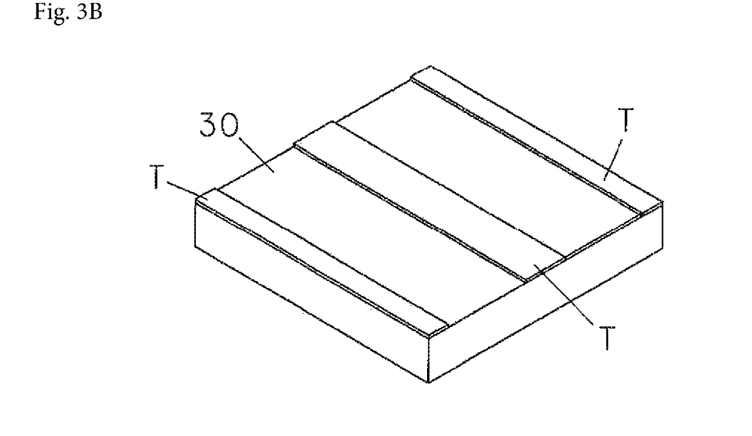
FIG. 3B is a perspective view for explaining a manufacturing step of an embodiment of a method of manufacturing a laminated electronic component of the present disclosure.

As shown in FIG. 3B, external terminals T are formed on the upper surface of the collective laminated body 30. The first end portions of the coils are connected to the external terminals T via the conductors and the second end portions are connected to the external terminals T via the conductors 34 having the surface at least partially exposed on the side surface of the element body.

Figure 3C:
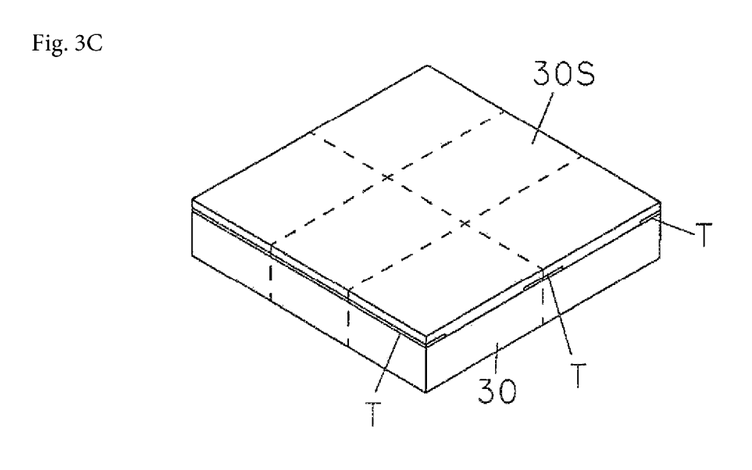
FIG. 3C is a perspective view for explaining a manufacturing step of an embodiment of a method of manufacturing a laminated electronic component of the present disclosure.

Subsequently, as shown in FIG. 3C, a disappearing layer 30S caused to disappear by heat treatment is formed on the upper surface of the collective laminated body 30 having the external terminals T formed thereon. The disappearing layer 30S caused to disappear by heat treatment is made of an organic substance, e.g., a binder resin, disappearing at a temperature lower than the degreasing temperature or the firing temperature of the element body and is formed on the entire upper surface of the collective laminated body 30, covering the external terminal T. Although the disappearing layer is disposed on the upper surface of the collective laminated body 30 in FIG. 3C, the disappearing layer can also be disposed on the bottom surface opposite to the upper surface, in addition to the upper surface. As a result, the laminated electronic component can be manufactured with higher dimensional accuracy.

Figure 4A:
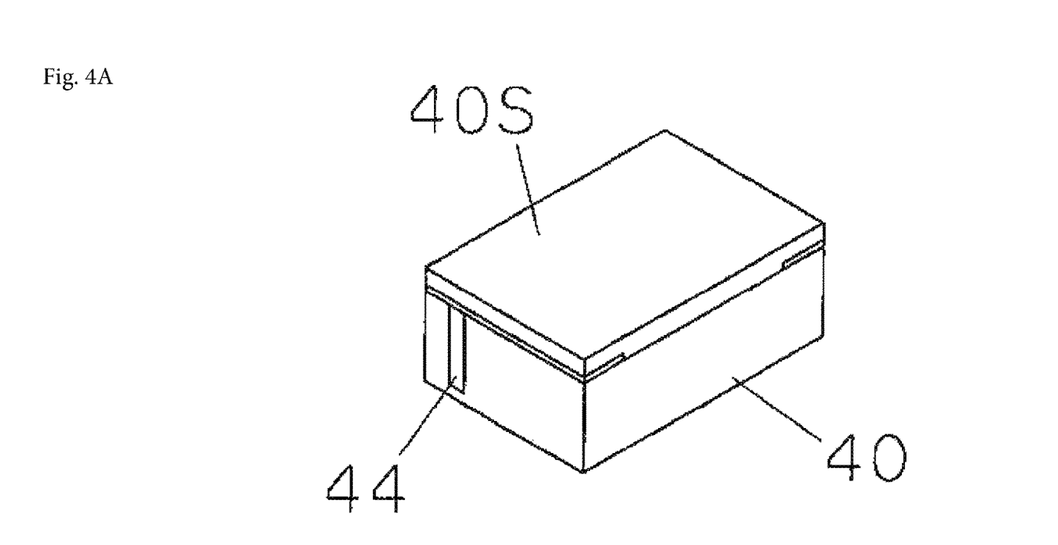
FIG. 4A is a perspective view for explaining a manufacturing process of an embodiment of the laminated electronic component of the present disclosure.

The collective laminated body 30 provided with the disappearing layer 30S caused to disappear by heat treatment is cut and divided in the lamination direction at portions indicated by dotted lines of FIG. 3C and is subjected to barrel polishing as needed so as to acquire each of element bodies 40 as shown in FIG. 4A. This element body 40 has a disappearing layer 40S caused to disappear by heat treatment on the upper surface, and the surface of the conductor 44 connected to the second end portion of the coil pattern is exposed on a longitudinal-direction side surface.

Figure 4B:
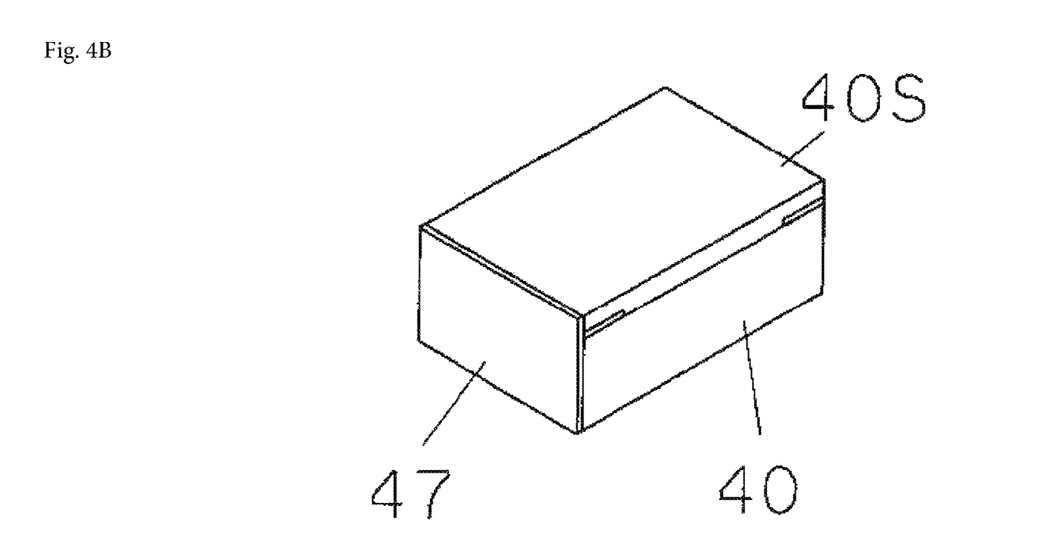
FIG. 4B is a perspective view for explaining a manufacturing process of an embodiment of the laminated electronic component of the present disclosure.

Subsequently, as shown in FIG. 4B, on the side surface of the element body 40 to which the second end portion of the coil is led out, an insulator precursor 47 is formed by an application method such as coating, so as to cover the conductor connecting the second end portion and the external terminal. The insulator precursor 47 is made of a material subjected to heat treatment to form an insulator film having insulation properties, for example, a dielectric material such as glass and glass ceramics, a magnetic material such as ferrite, or a nonmagnetic material, and is particularly made of a material forming the insulator film higher in volume resistivity and withstand voltage than the material constituting the element body.

Subsequently, the element body 40 is subjected to a heat treatment to remove the disappearing layer formed on the upper surface of the element body and to sinter the insulator precursor on the side surface of the element body and, as shown in FIG. 2, the laminated electronic component is acquired that has the external terminals 15, 16 formed on the bottom surface of the element body 10 and the insulator film 17 formed on one of the longitudinal-direction side surfaces.

In the laminated electronic component formed in this way, the disappearing layer caused to disappear by heat treatment disappears due to the heat treatment of the element body and, therefore, even if the insulator precursor is present on the upper surface side of the element body at the time of application of the insulator precursor to the element body, the insulator precursor on the upper surface side of the element body is removed along with this disappearing layer. As a result, the external terminals are formed with high dimensional accuracy so that the high-density mounting can be performed.

Although the magnetic material layers and the conductor patterns are laminated in the laminated electronic component described in the embodiment, insulating layers are laminated instead of the magnetic material layers with the conductor patterns in another embodiment. A laminated electronic component having the insulator layers and the conductor patterns laminated can be used as a capacitor, for example.

Although the embodiments of the laminated electronic component of the present disclosure have been described, the present disclosure is not limited to the embodiments. For example, although the element body is formed by laminating the magnetic material layers and the conductor patterns in the description of the embodiment, the element body may be formed by laminating insulator layers and conductor patterns. Although a coil is described as a circuit element formed in the element body, the circuit element may be a capacitor or a combination thereof. Furthermore, although the insulator precursor is entirely applied to one of the longitudinal-direction side surfaces of the element body in the description of the embodiments, the insulator precursor may be applied to a portion in which the conductor connecting the lead-out end and the external terminal is exposed in one of the longitudinal-direction side surfaces of the element body, may be applied to the entire side surfaces of the element body, or may be applied to the whole surfaces of the element body. In the embodiments, the external terminals are formed on the bottom surface of the element body such that the terminals are visible from the side surfaces; however, the external terminals may be formed on the bottom surface of the element body away from the sides adjacent to the side surfaces such that the terminals are invisible from the side surfaces. Furthermore, although the disappearing layer caused to disappear by heat treatment is formed on the entire upper surface of the collective laminated body in the examples, it is only required to cover the external terminals and the disappearing layer may partially be formed on the bottom surface of the collective laminated body such that the external terminals are covered. The disappearing layers caused to disappear by heat treatment may be formed on the upper and lower surfaces of the collective laminated body and, after the collective laminated body is cut and divided into respective element bodies and the insulator precursors are applied thereto, the element bodies may be subjected to the heat treatment so that the disappearing layers caused to disappear by heat treatment disappear.

The term "step" as used herein encompasses not only an independent step but also a step in which the anticipated effect of this step is achieved, even if the step cannot be clearly distinguished from another step.

It is to be understood that although the present disclosure has been described with regard to preferred embodiments thereof, various other embodiments and variants may occur to those skilled in the art, which are within the scope and spirit of the disclosure, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A method of manufacturing a laminated electronic component, having a circuit element formed in an element body, of pluralities of laminated insulator layers and conductor patterns with the conductor patterns between the laminated insulator layers, the method comprising:
    forming a collective laminated body including a plurality of element bodies having circuit elements formed therein by alternately laminating pluralities of insulator layers and conductor patterns;
    forming a plurality of external terminals on one of surfaces of the collective laminated body orthogonal to a lamination direction;
    forming a disappearing layer covering the external terminals and caused to disappear by heat treatment on the surface of the collective laminated body on which the plurality of external terminals is formed;
    cutting and dividing the collective laminated body having the disappearing layer formed thereon along the lamination direction into each of the element bodies, each of the element bodies including a portion of the external terminals and including a circuit element;
    applying an insulator precursor to a surface of at least one of the element bodies; and
    forming a laminated electronic component by applying a heat treatment to the at least one element body to which the insulator precursor is applied, wherein
    the circuit element of the laminated electronic component has a first end portion that is a lead-out end of the circuit element close to a bottom surface of the element body on which the portions of the external terminals are disposed and a second end portion that is a lead-out end of the circuit element distant from the bottom surface of the at least one element body, wherein
    the first end portion is connected to a first external terminal disposed on the bottom surface of the one least one element body while the second end portion is connected to a second external terminal disposed on the bottom surface of the one least one element body via a conductor disposed on a side surface of the one least one element body with a surface thereof at least partially exposed, and wherein
    the surface of the conductor exposed on the side surface of the one least one element body is covered with an insulator film that is a heat-treated object of the insulator precursor.

2. A method of manufacturing a laminated electronic component having a circuit element formed in an element body of pluralities of laminated magnetic material layers and conductor patterns with the conductor patterns between the laminated magnetic material layers, the method comprising:
    forming a collective laminated body including a plurality of element bodies having circuit elements formed therein by alternately laminating pluralities of magnetic material layers and conductor patterns;
    forming a plurality of external terminals on one of surfaces of the collective laminated body orthogonal to a lamination direction;
    forming a disappearing layer covering the external terminals and caused to disappear by heat treatment on the surface of the collective laminated body on which the plurality of external terminals is formed;
    cutting and dividing the collective laminated body having the disappearing layer formed thereon along the lamination direction into each of the element bodies, each of the element bodies including a portion of the external terminals and including a circuit element;
    applying an insulator precursor to a surface of at least one of the element bodies; and
    forming a laminated electronic component by applying a heat treatment to the at least one element body to which the insulator precursor is applied, wherein
    the circuit element of the laminated electronic component has a first end portion that is a lead-out end of the circuit element close to a bottom surface of the element body on which the portions of the external terminals are disposed and a second end portion that is a lead-out end of the circuit element distant from the bottom surface of the at least one element body, wherein
    the first end portion is connected to a first external terminal disposed on the bottom surface of the at least one element body while a second end portion is connected to the second external terminal disposed on the bottom surface of the at least one element body via a conductor disposed on a side surface of the at least one element body with a surface thereof at least partially exposed, and wherein
    the surface of the conductor exposed on the side surface of the at least one element body is covered with an insulator film that is a heat-treated object of the insulator precursor.

3. The method of manufacturing according to claim 1, wherein the forming of the disappearing layer includes further forming the disappearing layer on a surface of the collective laminated body opposite to the surface on which the external terminals are formed.

4. The method of manufacturing according to claim 2, wherein the forming of the disappearing layer includes further forming the disappearing layer on a surface of the collective laminated body opposite to the surface on which the external terminals are formed.

5. The method of manufacturing according to claim 1, wherein the insulator layers comprise magnetic material.

6. The method of manufacturing according to claim 3, wherein the insulator layers comprise magnetic material.

\* \* \* \* \*